(12) United States Patent
Fukuda et al.

(10) Patent No.: US 8,416,035 B2
(45) Date of Patent: Apr. 9, 2013

(54) MULTIBAND MATCHING CIRCUIT

(75) Inventors: Atsushi Fukuda, Yokosuka (JP); Hiroshi Okazaki, Zushi (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 37 days.

(21) Appl. No.: 13/210,936

(22) Filed: Aug. 16, 2011

(65) Prior Publication Data

US 2012/0044026 A1 Feb. 23, 2012

(30) Foreign Application Priority Data

Aug. 19, 2010 (JP) ................................. 2010-183782

(51) Int. Cl.
*H03H 7/38* (2006.01)
(52) U.S. Cl.
USPC ............................................ 333/124; 333/32
(58) Field of Classification Search .................... 333/32, 333/33, 124
See application file for complete search history.

(56) References Cited

U.S. PATENT DOCUMENTS

| 4,571,560 | A |  | 2/1986 | Dobrovolny |
|---|---|---|---|---|
| 6,621,376 | B2 | * | 9/2003 | Liu et al. .................... 333/126 |
| 7,656,249 | B2 |  | 2/2010 | Fukuda et al. |
| 2007/0018758 | A1 |  | 1/2007 | Fukuda et al. |
| 2007/0126526 | A1 |  | 6/2007 | Ataka et al. |
| 2008/0284539 | A1 |  | 11/2008 | Tateoka et al. |

FOREIGN PATENT DOCUMENTS

| EP | 1 775 847 A1 | 4/2007 |
|---|---|---|
| JP | 11-97946 | 4/1999 |
| JP | 2001-211097 | 8/2001 |
| JP | 2002-280926 | 9/2002 |
| JP | 2004-297633 | 10/2004 |
| JP | 2004-349740 A | 12/2004 |
| JP | 2007-259168 | 10/2007 |
| JP | 2008-263624 | 10/2008 |
| JP | 2008-283430 | 11/2008 |
| WO | WO 2004/082138 A1 | 9/2004 |

OTHER PUBLICATIONS

Extended European Search Report issued Sep. 10, 2012 in Patent Application No. 11177704.1.
Hiroshi Okazaki et al., "MEMS-Based Reconfigurable RF Circuits for Future Mobile Terminals", Microwave Conference, 2007. APMC 2007. Asia—Pacific, IEEE, XP-031279824, Dec. 11, 2007, pp. 1-4.
Atsushi Fukuda et. al., "Multi-band Power Amplifier Employing MEMS Switches for Optimum Matching," Proceedings of IEICE General Conference, 2004, 2 Pages.
Atsushi Fukuda et. al., "Evaluation on Insertion Loss of Switches for a Band-Switchable Matching Network," Proceedings of IEICE General Conference, 2009, 4 Pages.
Office Action issued May 29, 2012 in Japanese Patent Application No. 2010-183782 (with English-language translation).
Japanese Office Action (with English translation) mailed on Jan. 22, 2013, in counterpart Japanese Appln No. 2010-183782 (5 pages).

* cited by examiner

*Primary Examiner* — Stephen Jones
(74) *Attorney, Agent, or Firm* — Oblon, Spivak, McClelland, Maier & Neustadt, L.L.P.

(57) ABSTRACT

A multiband matching circuit of the present invention includes an inductive element having one end connected to an input terminal, a first switch having one end connected to the other end of the inductive element and the other end grounded, a capacitive element having one end connected to the input terminal, a second switch having one end connected to the other end of the capacitive element and the other end grounded, a first-band matching circuit that is connected between the other end of the inductive element and a first output terminal and performs impedance matching in a first frequency band, and a second-band matching circuit that is connected between the other end of the capacitive element and a second output terminal and performs impedance matching in a second frequency band higher than the first frequency band.

4 Claims, 6 Drawing Sheets

MULTIBAND MATCHING CIRCUIT

TECHNICAL FIELD

The present invention relates to a multiband matching circuit operating in each of multiple frequency bands and, in particular, to a low-loss multiband matching circuit.

BACKGROUND ART

One of the vital components of wireless equipment is a power amplifier. The power amplifier includes an amplification device and an impedance matching circuit. Conventional matching circuits satisfy matching requirements only at a certain frequency. However, recent mobile communication systems, for example, use multiple frequency bands. Therefore there is a need for power amplifiers that operate in multiple frequency bands.

One such technique is disclosed in Japanese Patent Application Laid-Open No. H11-97946. In the technique, multiple band-pass filters, each passing a corresponding signal in a superimposed input signal, are provided. Each band-pass filter transmits a signal in the single frequency band other than signals in other frequency bands. Matching circuits that operate in their respective frequency bands are also provided. An example of the technique is illustrated in FIG. 1A. In this example, two signals, a high frequency band signal and a low frequency band signal, are amplified. One end of a high band pass filter (HBPF) 4H and one end of a low band pass filter (LBPF) 4L are connected to an input terminal P2 connected to an output terminal of a given device (for example an amplification device 20). A high band matching circuit 5H is connected between the other end of the HBPF 4H and an output terminal P1H. A low band matching circuit 5L is connected between the other end of the LBPF 4L and an output terminal P1L. Loads 30H and 30L with impedance $Z_0$ are connected to the output terminal P1H and P1L, respectively.

The high band matching circuit 5H matches the impedance at the input terminal P2 to the impedance at the output terminal P1H in the high frequency band by taking the presence of the HBPF 4H into account. The low band matching circuit 5L matches the impedance at the input terminal P2 to the impedance at the output terminal P1L in the low band by taking the presence of the LBPF 4L into account. The band-pass filter is typically made up of multiple reactance elements.

The configuration illustrated in FIG. 1A requires an increased number of filter stages in order to sufficiently attenuate out-of-band signals. However, the increased number of filter stages causes the problem of losses in passband signals.

In order to increase the degree of isolation between the high-frequency band circuit and the low-frequency band circuit, as shown by the dashed line in FIG. 1B, it may be contemplated to provide a switch SWH between the input terminal P2 and the HBPF 4H and a switch SWL between the input terminal P2 and the LBPF 4L. However, when the output impedance of the transistor that constitutes a high power amplification device 20, for example, is very small (for example less than a few ohms), a considerably high current flows through the switches and accordingly a significantly large insertion loss is caused by the on-resistances of the switches. In view of this problem, it is desirable that switches with low-on-resistances be used. However, low-on-resistance switches have a problem that the degree of isolation decreases when the switches are in the off-state. Therefore, in the state of the art, there has been no choice but accept a certain level of insertion loss caused by the on-resistance of switches and high current flowing through the switches.

SUMMARY OF THE INVENTION

In light of the problems, the present invention provides a low-loss multiband matching circuit.

A multiband matching circuit according to the present invention comprises:

an input terminal configured to be connected to an alternating-current circuit; a first output terminal configured to be connected to a device having a predetermined impedance; a second output terminal configured to be connected to a device having a predetermined impedance;

an inductive element having one end connected to the input terminal;

a first switch having one end connected to the other end of the inductive element and the other end grounded;

a capacitive element having one end connected to the input terminal;

a second switch having one end connected to the other end of the capacitive element and the other end grounded;

a first-band matching circuit inserted between the first output terminal and a first connection point of the inductive element and the first switch, the first-band matching circuit matching an impedance at the first connection point to an impedance at the first output terminal in a first frequency band; and a second-band matching circuit inserted between the second output terminal and a second connection of the capacitive element and the second switch, the second-band matching circuit matching an impedance at the second connection point to an impedance at the second output terminal in a second frequency band higher than the first frequency band.

EFFECTS OF THE INVENTION

According to the present invention, loss in a multiband matching circuit is reduced. When an amplifier is provided with the multiband matching circuit according to the present invention, signals in multiple frequency bands are efficiently amplified.

DETAILED DESCRIPTION OF THE EMBODIMENTS

Embodiments of a multiband matching circuit according to the present invention will be described with reference to FIGS. 2 to 10.

First Embodiment

Figure 2:
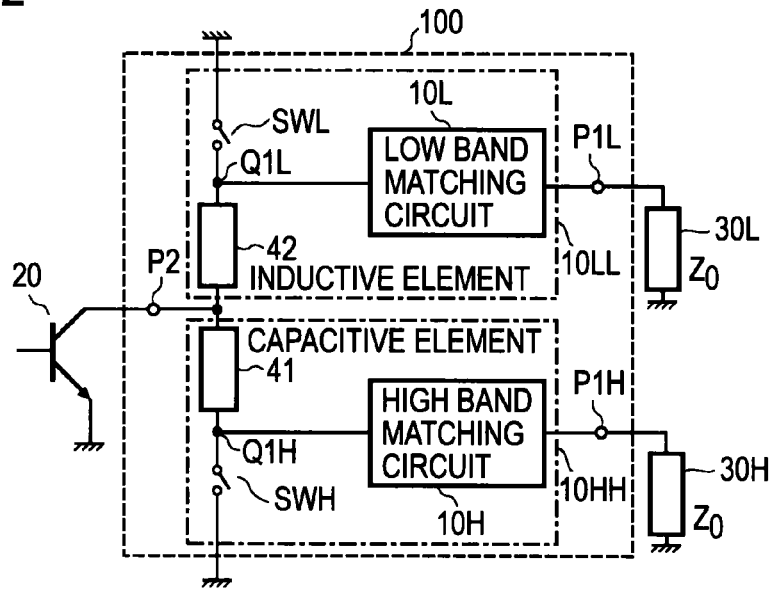
FIG. 2 is a block diagram illustrating a first embodiment of a multiband matching circuit according to the present invention.

FIG. 2 illustrates a first embodiment of a multiband matching circuit according to the present invention. In the first embodiment, a multiband matching circuit 100 accommodating two frequency bands, namely low and high frequency bands, will be described.

The multiband matching circuit 100 includes an inductive element 42, a switch SWL, a low band matching circuit 10L, a capacitive element 41, a switch SWH, a high band matching circuit 10H, an input terminal P2, and output terminals P1L and P1H. It should be noted that the capacitive element 41 and the inductive element 42 are reactance elements.

One end of the inductive element 42 is connected to the input terminal P2. The other end of the inductive element 42 is connected to one end of the switch SWL and the other end of the switch SWL is connected to a ground. One end of the low band matching circuit 10L is connected to a connection point Q1L between the inductive element 42 and the switch SWL, and the other end of the low band matching circuit 10L is connected to the output terminal P1L.

One end of the capacitive element 41 is connected to the input terminal P2. The other end of the capacitive element 41 is connected to one end of the switch SWH and the other end of the switch SWH is connected to the ground. One end of the high band matching circuit 10H is connected to a connection point Q1H between the capacitive element 41 and the switch SWH, and the other end of the high band matching circuit 10H is connected to the output terminal P1H.

The input terminal P2 of the multiband matching circuit 100 is configured to be connected to a given alternating-current (AC) circuit. Examples of such an AC circuit include an electronic device such as an amplification device 20. The input terminal P2 is connected to one output end of the amplification device 20, for example, as illustrated in FIG. 2. The amplification device 20 may be a transistor, an FET (Field Effect Transistor), a MOSFET (Metal Oxide Semiconductor FET), or a TFT (Thin Film Transistor), for example. While the amplification device 20 depicted in the drawings is an n-channel junction FET, it is illustrative only and is not intended to limit the amplification device 20 to an n-channel junction FET.

Loads 30L and 30H with predetermined impedance $Z_0$ are connected to the output terminals P1L and P1H, respectively. It is assumed here that the impedance at the output terminals P1L and P1H is $Z_0$. While the loads 30L and 30H have the same impedance, the loads 30L and 30H may have different impedances.

For example, if the capacitive element 41 is a capacitor with a capacitance C and the inductive element 42 is an inductor with an inductance L, the impedance $Z_C$ of the capacitor at frequency f can be expressed by Equation (1) and the impedance $Z_L$ of the inductor at frequency f can be expressed by Equation (2). Here, j is an imaginary unit and π is the circumference ratio.

$$Z_C = \frac{1}{j2\pi fC} \quad (1)$$

$$Z_L = j2\pi fL \quad (2)$$

When a signal in a low frequency band $F_L$ is output from the amplification device 20, the switch SWH is turned on (brought into the conduction state, namely the on-state) and the switch SWL is turned off (brought into the non-conduction state, namely the off-state) in the multiband matching circuit 100. The low band matching circuit 10L is configured to match the impedance at the connection point Q1L as viewed from one end of the low band matching circuit 10L toward the amplification device 20 to the impedance at the output terminal P1L (that is, the impedance $Z_0$ of the load 30L) in the low frequency band $F_L$. As can be seen from Equation (1), when the frequency f of a signal is within the low frequency band $F_L$, the impedance $Z_C$ is large and accordingly high-frequency signal current in the low frequency band $F_L$ that flows through the switch SWH in the on-state is small. Consequently, insertion loss due to the on-resistance of the switch SWH is small. Since the switch SWH is in the on-state, the connection point Q1H is practically short-circuited even allowing for resistive components of the switch SWH. Therefore, almost no signal in the low frequency band $F_L$ is input into the high band matching circuit 10H. In other words, signals in the low frequency band $F_L$ from the amplification device 20 are input into the low band matching circuit 10L.

When a signal in a high frequency band $F_H$ is output from the amplification device 20, the switch SWL is turned on and the switch SWH is turned off in the multiband matching circuit 100. The high band matching circuit 10H is configured to match the impedance at the connection point Q1H as viewed from one end of the high band matching circuit 10H toward the amplification device 20 to the impedance at the output terminal P1L (that is, the impedance $Z_0$ of the load 30H) in the high frequency band $F_H$. As can be seen from Equation (2), when the frequency f of a signal is within the high frequency band $F_H$, the impedance $Z_L$ is large and accordingly high-frequency signal current in the high frequency band $F_H$ that flows through the switch SWL in the on-state is small. Consequently, insertion loss due to the on-resistance of the switch SWL is small. Since the switch SWL is in the on-state, the connection point Q1L is practically short-circuited even allowing for resistive components of the switch SWL. Therefore, almost no signal in the high frequency band $F_H$ is input into the low band matching circuit 10L. In other words, signals in the high frequency band $F_H$ from the amplification device 20 are input into the high band matching circuit 10H.

Figure 1A:
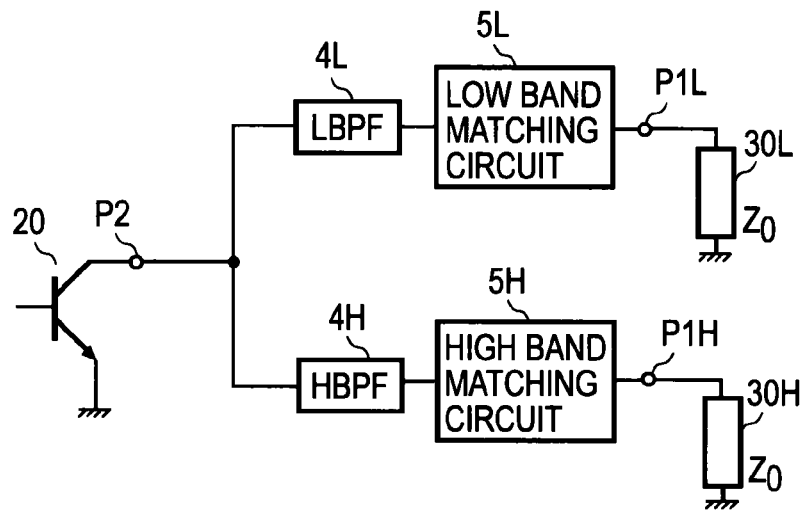
FIG. 1A is a block diagram illustrating an example of an existing multiband matching circuit.
Figure 1B:
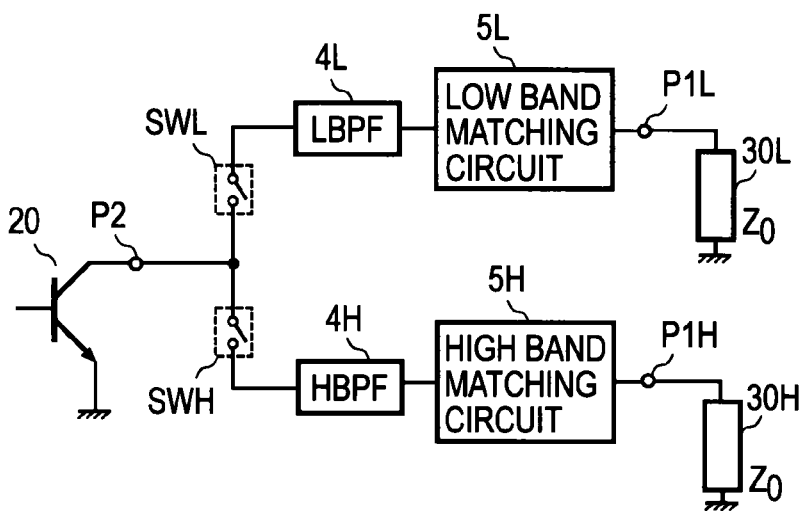
FIG. 1B is a block diagram illustrating an example of a multiband matching circuit in connection with the circuit illustrated in FIG. 1A.

The configuration of the multiband matching circuit 100 can extract frequency bands without using band-pass filters. Therefore, signals from an electronic device (the amplification device 20 in this case) can be distributed to the two signal paths, that is, the high and low frequency band signal paths, without a loss of a pass-band signal due to a multi-stage filter. When one of the switches SWL and SWH is in the on-state, current flowing to the switch in the on-state is small and therefore insertion loss due to the on-resistance is small. It should be noted that the switch through which a signal does not flow is turned on in the multiband matching circuit 100, unlike in the configuration illustrated in FIG. 1B.

While the embodiment has been described with respect to an example in which the multiband matching circuit 100 is connected to the output of the amplification device 20, the multiband matching circuit 100 can be connected to the input of the amplification device 20.

As apparent from the foregoing, a conventional matching circuit having any configuration can be used as the low band matching circuit 10L in the multiband matching circuit 100. Similarly, a conventional matching circuit having any configuration can be used as the high band matching circuit 10H in the multiband matching circuit 100. The switches, including the switches SWL and SWH, used herein are not limited to contact switches. For example, the switches may be so-called switching elements, such as diodes or transistors, for example, that have the function of making and breaking a circuit without using contacts on a circuit network. Examples of such switches include MEMS (Micro-Electro Mechanical Systems) switches and switching diodes.

The capacitive element 41 has the function of blocking signals in a low frequency band whereas the inductive element 42 has the function of blocking signals in a high frequency band. Therefore, the capacitance C of the capacitive element 41 and the inductance L of the inductive element 42 are determined by the frequencies of signals in the low frequency band $F_L$ to be matched and the frequencies of signals in the high frequency band $F_H$ to be matched, which are design parameters. The capacitance C and the inductance L determined during design of the multiband matching circuit 100 are not changed during actual use. As can be seen from Equations (1) and (2), the capacitive element 41 and the inductive element 42 generally have frequency characteristics. Therefore, it should be noted that the low band matching circuit 10L is designed by taking into consideration the frequency characteristics of the inductive element 42 and the high band matching circuit 10H is designed by taking into consideration the frequency characteristics of the capacitive element 41. In this context, the circuit part including the low band matching circuit 10L, the inductive element 42 and the switch SWL can be considered as one matching circuit (referred to as a low band matching circuit part 10LL hereafter) and the circuit part including the high band matching circuit 10H, the capacitive element 41 and the switch SWH can be considered as one matching circuit (referred to as a high band matching circuit part 10HH hereafter). In this case, the low band matching circuit part 10LL can be described as a circuit that matches the impedance at the input terminal P2 to the impedance at the output terminal P1L (that is, the impedance $Z_0$ of the load 30L) in the low frequency band $F_L$, and the high band matching circuit part 10HH can be described as a circuit that matches the impedance at the input terminal P2 to the impedance at the output terminal P1H (the impedance $Z_0$ of the load 30H) in the high frequency band $F_H$.

Second Embodiment

While the first embodiment has been described with respect to an example in which signals are distributed to signal paths for two frequency bands, a second embodiment will be described with respect to an example in which signals are distributed to signal paths for three frequency bands. The following description will focus on differences between the second embodiment and the first embodiment. A multiband matching circuit 200 of the second embodiment illustrated in FIG. 3 includes a switch SWM, a series resonator 43 made up of a capacitive element and an inductive element connected in series, and an intermediate band matching circuit 10M in addition to the components of the multiband matching circuit 100 of the first embodiment. Specifically, the multiband matching circuit 200 has the following configuration. One end of the series resonator 43 is connected to the connection point Q1M (that is, an input terminal P2) between the capacitive element 41 and the inductive element 42. The other end of the series resonator 43 is connected to one end of the intermediate band matching circuit 10M, and the other end of the intermediate band matching circuit 10M is connected to an output terminal P1M. On end of the switch SWM is connected to the connection point R between the series resonator 43 and the intermediate band matching circuit 10M, and the other end of the switch SWM is connected to a ground. Low frequency band $F_L$, intermediate frequency band $F_M$ and high frequency band $F_H$ are in the relation: $F_L < F_M < F_H$.

When a signal in the intermediate frequency band $F_M$ is output from the amplification device 20, the switches SWH and SWL are turned on and the switch SWM is turned off in the multiband matching circuit 200. The intermediate band matching circuit 10M is configured to match the impedance at the interconnection point R as viewed from one end of the intermediate band matching circuit 10M toward the amplification device 20 to the impedance at an output terminal P1M (a predetermined impedance $Z_0$ of a load 30M) in the intermediate band $F_M$. Since the switches SWH and SWL are in the on-state, the connection points Q1H and Q1L are practically short-circuited even allowing for resistive components of the switches SWH and SWL and therefore almost no signal in the intermediate frequency band $F_M$ is input into the high band matching circuit 10H and the low band matching circuit 10L. In other words, signals in the intermediate frequency band $F_M$ from the amplification device 20 are input into the intermediate band matching circuit 10M.

When a signal in the low frequency band $F_L$ is output from the amplification device 20, the switches SWH and SWM are turned on and the switch SWL is turned off in the multiband matching circuit 200. Since the switch SWM is in the on-state, the connection point R is practically short-circuited even allowing for resistive components of the switch SWM and therefore almost no signal in the low frequency band $F_L$ is input into the intermediate band matching circuit 10M. Therefore, as with the first embodiment, signals in the low frequency band $F_L$ from the amplification device 20 are input into the low band matching circuit 10L.

When a signal in the high frequency band $F_H$ is output from the amplification device 20, the switches SWL and SWM are turned on and the switch SWH is turned off in the multiband matching circuit 200. Since the switch SWM is in the on-stage, the connection point R is practically short-circuited even allowing for resistive components of the switch SWM and therefore almost no signal in the high frequency band $F_H$ is input into the intermediate band matching circuit 10M. Therefore, as with the first embodiment, signals in the high frequency band $F_H$ from the amplification device 20 are input into the high band matching circuit 10H.

The impedance $Z_R$ of the series resonator 43 made up of the capacitor with capacitance $C_1$ and the inductor with inductance $L_1$ can be expressed by Equation (3). First and second conditions that the capacitance $C_1$ and inductance $L_1$ need to satisfy will be described below. The impedance $Z_R$ of the series resonator 43 is minimum (ideally zero) when resonance frequency $f_0 = 1/(2\pi\sqrt{(C_1 L_1)})$, where $\sqrt{(C_1 L_1)}$ indicates a square root of $C_1 L_1$. Therefore, the first condition is that the capacitance $C_1$ and the inductance $L_1$ have values such that the resonance frequency $f_0$ falls into the intermediate frequency band $F_M$.

$$Z_R = j2\pi f L_1 + \frac{1}{j2\pi f C_1} \quad (3)$$

When a signal in the low frequency band $F_L$ or a signal in the high frequency band $F_H$ is output from the amplification device 20, the switch SWM is turned on. In order to minimize insertion loss, current flowing to the switch SWM needs to be minimized. Therefore, the second condition is that when a signal in the low frequency band $F_L$ is output from the amplification device 20, capacitance $C_1$ be set such that the value of the second term on the right-hand side of Equation (3) will be large enough to suppress the current flowing to the switch SWM and when a signal in the high frequency band $F_H$ is output from the amplification device 20, the inductance $L_1$ be set such that the value of the first term on the right-hand side of Equation (3) will be large enough to suppress the current flowing to the switch SWM. As can be seen from the fact that frequency f is included in the first and second terms on the right-hand side of Equation (3), the second condition depends on the frequency of the signal in the low frequency band $F_L$ to be matched and the frequency of the signal in the high frequency band $F_H$ to be matched. However, since the frequencies are design parameters that are known, the specific values of the capacitance $C_1$ and the inductance $L_1$ that satisfy the first and second conditions can be determined. If the series resonator 43 is configured with the capacitor having the capacitance $C_1$ that satisfies the first and second conditions and the inductor with the inductance $L_1$ that satisfies the first and second conditions, the impedance $Z_R$ of the series resonator 43 will be large both when a signal in the low frequency band $F_L$ is output from the amplification device 20 and when a signal in the high frequency band $F_H$ is output from the amplification device 20. Accordingly, high-frequency signal current flowing to the switch SWM will be small. Therefore, insertion loss due to the on-resistance of the switch SWM is small.

In the multiband matching circuit 200, as with the first embodiment, a conventional matching circuit having any configuration can be used as the intermediate band matching circuit 10M. While the loads 30L, 30M and 30H have the same impedance in the example, the load 30M may have a different impedance from the other loads. As with the first embodiment, the configuration of the multiband matching circuit 200 can extract frequency bands without using band-pass filters. Therefore, signals from an electronic device (the amplification device 20 in this case) can be distributed to the three signal paths, that is, the high, intermediate and low frequency band signal paths, without a loss of a pass-band signal due to a multi-stage filter. Since current flowing through switches turned on depending on a selected band is small, insertion loss due to the on-resistance is small. While the second embodiment has been described with respect to an example in which the multiband matching circuit 200 is connected to the output of the amplification device 20, the multiband matching circuit 200 may be connected to the input of the amplification device 20.

The capacitance $C_1$ and the inductance $L_1$ determined during design of the multiband matching circuit 200 are not changed during actual use. As can be seen from Equation (3), the series resonator 43 generally has frequency characteristics. Therefore, it should be noted that the intermediate band matching circuit 10M is designed by taking into consideration the frequency characteristics of the series resonator 43. In this context, the circuit part including the intermediate band matching circuit 10M, the series resonator 43 and the switch SWM can be considered as one matching circuit (referred to as an intermediate band matching circuit part 10MM hereafter). In this case, the intermediate band matching circuit part 10MM can be described as a circuit that matches the impedance at the input terminal P2 to the impedance at the output terminal P1M (that is, the impedance $Z_0$ of the load 30M) in the intermediate frequency band $F_M$.

Third Embodiment

In the first embodiment, signals are distributed to signal paths for two frequency bands and each of the matching circuits 10L and 10H performs impedance matching in the corresponding one frequency band. In the second embodiment, signals are distributed to signal paths for three frequency bands and each of the matching circuits 10L, 10M and 10H performs impedance matching in the corresponding one frequency band. In the third embodiment, a multiband matching circuit disclosed in a non-patent literature, Atsushi Fukuda et al., "Multiband Power Amplifier Employing MEMS Switches for Optimum Matching", Proceedings of The Institute of Electronics, Information and Communication Engineers General Conference 2004, C-2-4, p. 39, or International Publication WO2004/082138, is used as any or all of the matching circuits 10L, 10M and 10H to enable impedance matching for more frequency bands.

Figure 4:
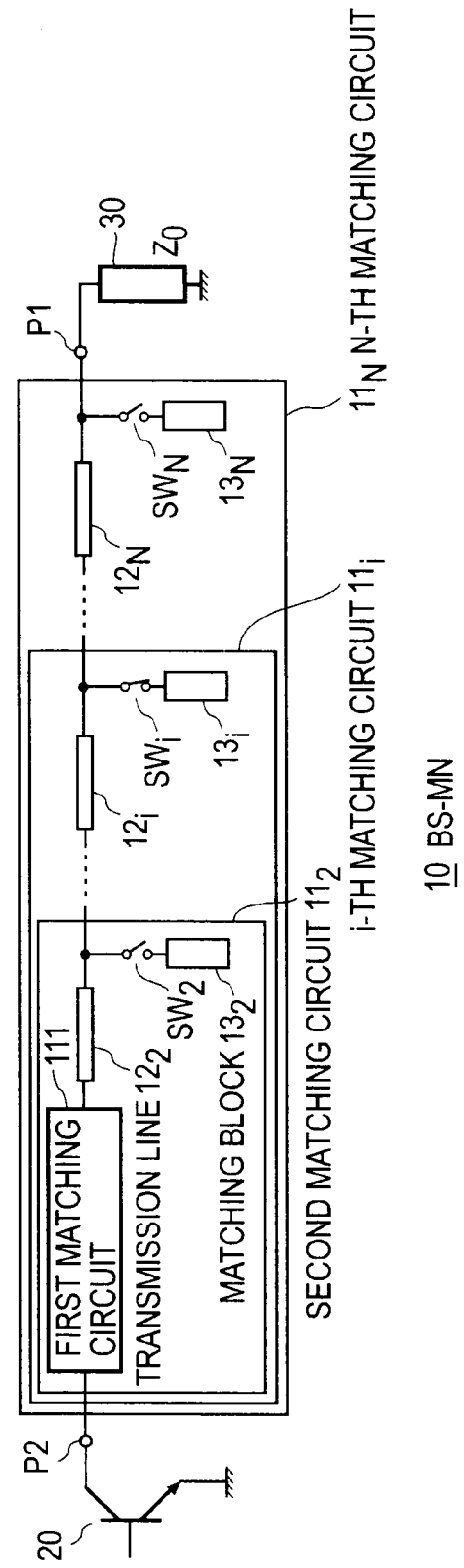
FIG. 4 is a block diagram illustrating an example of an existing band-switchable matching network that can applied to the present invention.

FIG. 4 illustrates an exemplary matching network 10 disclosed in the non-patent literature (hereinafter referred to as Band-Switchable Matching Network and abbreviated as BS-MN) that can be used as at least one of the matching circuits 10L, 10M and 10H. The BS-MN 10 will be described with reference to FIG. 4. The BS-MN 10 is configured to perform selective impedance matching at each of N frequencies $f_1, \ldots, f_N$ (N is a predetermined integer greater than or equal to 2 and, for convenience of explanation, it is assumed here that $f_N < f_{N-1} < \ldots < f_2 < f_1$, but the frequencies may be $f_1 < f_2 < \ldots < f_{N-1} < f_N$, for example). For convenience of explanation of operations of the BS-MN 10, it is assumed that the BS-MN 10 is a matching network that performs impedance matching between an amplification device 20 and a load 30. Here, $f_i$ represents the center frequency of the i-th frequency band.

The BS-MN 10 includes a first matching circuit 111, N−1 transmission lines $12_i$ (i=2, . . . , N), N−1 switches $SW_i$ (i=2, . . . , N), and N−1 matching blocks $13_i$ (i=2, . . . , N). Each of the N−1 transmission lines $12_i$ has a characteristic impedance equal to the impedance $Z_0$ of the load 30. One end of the first matching circuit 111 is connected to an input terminal P2 and the other end of the first matching circuit 111 is connected to one end of transmission line $12_2$. If N is greater than or equal to 3, the other end of the transmission line $12_i$ is connected to one end of transmission line $12_{i+1}$ (i=2, . . . , N−1) and the other end of the transmission line $12_N$ is connected to an output terminal P1. If N is equal to 2, the other end of the transmission line $12_2$ is connected to the output terminal P1. If N is greater than or equal to 3, one end of the switch $SW_i$ is connected to the connection point between the transmission lines $12_i$ and $12_{i+1}$, the other end of the switch $SW_i$ is connected to the matching block $13_i$ (i=2, . . . , N−1), one end of the switch $SW_N$ is connected to the other end of the transmission line $12_N$ (which end can also be said to be the connection point between the transmission line $12_N$ and the output terminal P1), and the other end of the switch $SW_N$ is connected to the matching block $13_N$. If N is equal to 2, one end of the switch $SW_2$ is connected to the other end of the transmission line $12_2$ (which end can also be said to be the connection point between the transmission line $12_2$ and the output terminal P1) and the other end of the switch $SW_2$ is connected to the matching block $13_2$.

The first matching circuit $11_1$, the transmission line $12_2$, the switch $SW_2$ and the matching block $13_2$ constitute a second matching circuit $11_2$. The second matching circuit $11_2$, the transmission line $12_3$, the switch $SW_3$ and the matching block $13_3$ constitute a third matching circuit $11_3$. Similarly, the (i−1)-th matching circuit $11_{(i-1)}$, the transmission line $12_i$, the switch $SW_i$, and the matching block $13_i$ constitute the i-th matching circuit $11_i$ (i=2, . . . , N). The first matching circuit $11_1$ is also called the primary matching circuit. In this way, the N matching circuits in a nested configuration are included in the BS-MN 10.

At the first frequency $f_1$, all switches $SW_2$, . . . , $SW_N$ are turned off. The primary matching circuit $11_1$ is a circuit that converts the impedance $Z_{P2}(f_1)$ of the amplification device 20 at the input terminal P2 to the impedance $Z_0$. Since each of the N−1 transmission circuits $12_i$ has a characteristic impedance equal to the impedance $Z_0$ of the load 30, the impedance $Z_{P1}(f_1)$ of a signal with the first frequency $f_1$ at the output terminal P1 is $Z_0$ and therefore the impedance $Z_{P2}(f_1)$ at the input terminal P2 matches the impedance $Z_0$ of the load 30.

For impedance matching at other frequencies $f_i$ (i=2, . . . , N), only the switch $SW_i$ is turned on. By appropriately designing the line length of the transmission lines $12_2$, . . . , $12_i$ and the reactance value of the matching block $13_i$ connected through the switch $SW_i$ beforehand, the impedance $Z_{P2}(f_i)$ at the input terminal P2 for a signal with frequency $f_i$ can be matched to the impedance $Z_0$ of the load 30. Thus, the BS-MN 10 illustrate in FIG. 4 is capable of functioning as a matching circuit at each of the N frequencies. Using the BS-MN 10 as an input-output matching circuit for the amplification device 20 enables the amplification device 20 to function as an amplifier amplifying a signal with frequency $f_1$ when all switches $SW_2$, . . . , $SW_N$ are in the off-state and function as an amplifier amplifying a signal with frequency $f_i$ when the switch $SW_i$ is turned on. Thus, a power amplifier that accommodates N frequencies can be implemented.

The band-switchable matching network (BS-MN) 10 illustrated in FIG. 4 can be used as any or all of the high band matching circuit 10H, the intermediate band matching circuit 10M and the low band matching circuit 10L.

To perform impedance matching for N frequencies, the N frequencies are classified into two or three bands according to the degree of inequality among frequencies $f_i$ (i=1, . . . , N).

For example, if inequality among N frequencies $f_i$ (i=1, . . . , N) is $f_1 > f_2 > \ldots > f_m \gg f_{m+1} > \ldots > f_{N-1} > f_N$, then the N (=n+m, where m and n are integers greater than or equal to 1) frequencies $f_1, \ldots, f_N$ may be classified into two frequency bands: a high frequency band including $f_1, f_2, \ldots, f_m$ and a low frequency band including $f_{m+1}, f_{m+2}, \ldots, f_N$. Then the high band matching circuit 10H in the multiband matching circuit 100 may be used to perform impedance matching for the m frequencies $f_1, f_2, \ldots, f_m$ and the low band matching circuit 10L may be used to perform impedance matching for the n frequencies $f_{m+1}, \ldots, f_{m+2}, \ldots, f_N$.

If inequality among N frequencies $f_i$ (i=1, . . . , N) is $f_1 > f_2 > \ldots > f_m \gg f_{m+1} > \ldots > f_{m+p} \gg f_{m+p+1} > \ldots > f_{N-1} > f_N$, the N (=n+m+p, where m, n and p are integers greater than or equal to 1) frequencies $f_1, \ldots, f_N$ may be classified into three frequency bands: a high frequency band including $f_1, f_2, \ldots, f_m$, an intermediate frequency band including $f_{m+1}, f_{m+2}, f_{m+p}$, and a low frequency band including $f_{m+p+1}, f_{m+p+2}, \ldots, f_N$. Then, the high band matching circuit 10H in the multiband matching circuit 200 may be used to perform impedance matching for the m frequencies $f_1, f_2, \ldots, f_m$, the intermediate band matching circuit 10M may be used to perform impedance matching for the p frequencies $f_{m+1}, f_{m+2}, \ldots, f_{m+p}$, and the low band matching circuit 10L may be used to perform impedance matching for the n frequencies $f_{m+p+1}, f_{m+p+2}, \ldots, f_N$.

Classifying frequencies in a certain narrow range as one frequency band can offer an advantage described below. An example will be described in which a band-switchable matching network (BS-MN) 10 is used as the high band matching circuit 10H, the intermediate band matching circuit 10M or the low band matching circuit 10L. When impedance matching is performed at a frequency $f_i$ in the configuration of the BS-MN 10, there is the possibility that the reactance of each of two or more matching blocks 13 can be used to accomplish the impedance matching at the frequency $f_i$ by turning on one or more switches $SW_j$ (j≠i) in addition to the switch $SW_i$ associated with the frequency $f_i$, unlike the foregoing. To perform impedance matching for a frequency $f_i$ and a different frequency $f_k$, a matching block $13_i$ for the frequency $f_i$ and another matching block $13_k$ for the frequency $f_k$ are required in general as described earlier. However, if the frequencies $f_i$ and $f_k$ are close to each other, for example, impedance matching at the frequency $f_i$ may be possible using the matching block $13_k$. By incorporating the possibilities into the design, a BS-MN 10 including matching blocks 13 and transmission lines 12 fewer than n can be configured when n frequencies are included in one frequency band, for example. This means reduction of the size of the multiband matching circuit.

If there is not a notable difference in inequality among N frequencies $f_i$ (i=1, . . . , N), the N frequencies $f_i$ (i=1, . . . , N) may be substantially equally separated into two or three, for example. If N is an even number, a configuration of the BS-MN 10 that accommodates N/2 frequencies may be applied to both of the low and high matching circuits 10L and 10H to enable the multiband matching circuit 100 to perform impedance matching at N frequencies. Although a BS-MN 10 by itself is capable of impedance matching for N frequencies, the multiband matching circuit in each of the matching circuits 10L and 10H in the configuration has half the number of stages of the N-stage of the BS-MN 10. Accordingly, the length of the path from the input terminal P2 to each of the output terminals P1L and P1H is shorter. Thus, size reduction of the multiband matching circuit is accomplished.

Advantage of using multiple band matching circuits (for example two matching circuits, the low and high band matching circuits 10L and 10H, included in the multiband matching circuit 100) for impedance matching for N frequencies over using a single BS-MN 10 will be described below.

In the configuration of the BS-MN 10, loss due to the on-resistance of a selected switch $SW_i$ is loss in the matching circuit and reduces output power and efficiency of the power amplifier. For example, when a signal with frequency $f_1$ is amplified, no loss due to on-resistance occurs because all switches $SW_2$, . . . , $SW_N$ are in the off-state. On the other hand, when a signal with frequency $f_i$ (i=2, 3, . . . , N) is amplified, the switch $SW_i$ is turned on, the input/output impedance $Z_{P2}(f_i)$ of the amplification device 20 is converted to impedance $Z_1(f_i)$ by the first matching circuit, and the impedance $Z_1(f_i)$ is then converted to impedance $Z_0$ by the transmission lines $12_2$, . . . , $12_i$ and the matching block $13_i$. Here, if the ratio Γ of conversion from impedance $Z_1(f_i)$ to impedance $Z_0$ shown in Equation (4) is large, high-frequency current flowing into the switch $SW_i$ in the on-state is large (Reference: Atsushi Fukuda et al., "Evaluation on Insertion Loss of Switches for a Band-Switchable Matching Network", The Institute of Electronics Information and Communication Engineers General Conference, 2009, C-2-6).

$$\Gamma = \frac{Z_0 - Z_1(f_i)}{Z_0 + Z_1(f_i)} \qquad (4)$$

Here, if the frequencies $f_1$ and $f_i$ are close to each other, impedance $Z_1(f_i)$ is close to impedance $Z_0$ and therefore $\Gamma$ is small. That is, the amount of high-frequency current flowing to the switch $SW_i$ is small and so is the loss due to the on-resistance. On the other hand, if the frequencies $f_1$ and $f_i$ are far from each other, impedance $Z_1(f_1)$ is far from impedance $Z_0$ and therefore $\Gamma$ is large. That is, high-frequency current flowing to the switch $SW_i$ is large and the loss due to the on-resistance is also large. As can be seen from the foregoing, high-frequency current flowing to each switch $SW_i$ in the on-state can be reduced by causing multiple matching circuits associated with frequency bands each including frequencies close to each other (for example the two matching circuits, the low and high band matching circuits 10L and 10H, in the multiband matching circuit 100) to perform impedance matching for N frequencies in a distributed manner.

The advantage described above will be described more specifically with respect to an example. If impedance matching for four frequencies $f_1$, $f_2$, $f_3$ and $f_4$ ($f_1 > f_2 > f_3 > f_4$) were performed using a BS-MN 10 supporting the four frequencies, the value $\Gamma$ of Equation (4) would be large because $f_1 \gg f_4$ for i=4. Accordingly, high-frequency current flowing to the switch $SW_4$ would be large.

On the other hand, impedance matching for four frequencies $f_1$, $f_2$, $f_3$ and $f_4$ ($f_1 > f_2 > f_3 > f_4$) performed by the low band matching circuit 10L and the high band matching circuit 10H in a distributed manner will be examined below. In this case, the low band matching circuit 10L performs impedance matching for two frequencies $f_1$ and $f_2$ ($f_1 > f_2$), for example, whereas the high band matching circuit 10H performs impedance matching for the other two frequencies $f_3$ and $f_4$ ($f_3 > f_4$).

Figure 5:
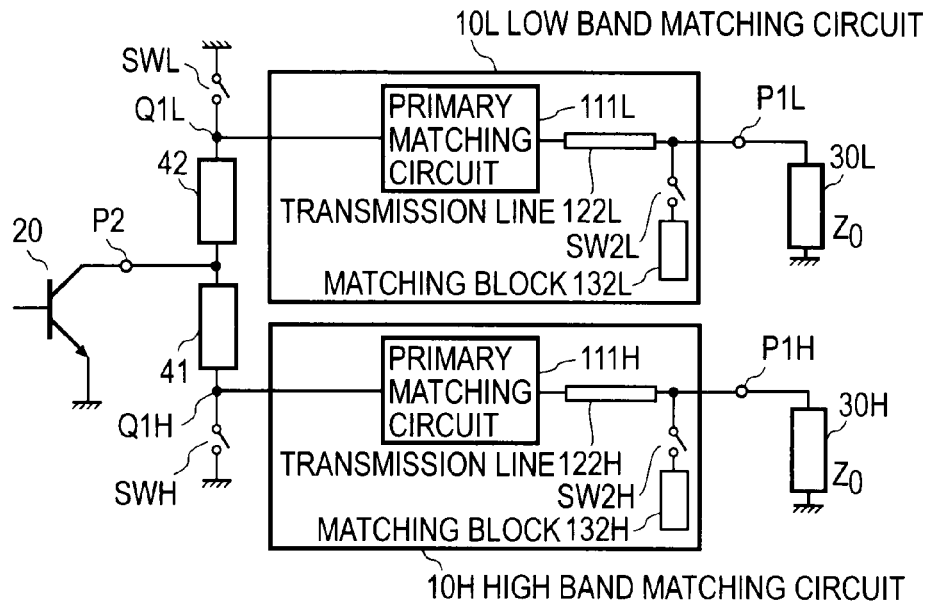
FIG. 5 is a block diagram of an embodiment in which the matching circuit illustrated in FIG. 4 is applied to the multiband matching circuit illustrated in FIG. 2.

Here, as illustrated in FIG. 5, the high band matching circuit 10H has the same configuration as a BS-MN 10 supporting two frequencies $f_1$ and $f_2$ and includes a primary matching circuit 111H, one transmission line 122H, one switch SW2H, and one matching block 132H. The transmission line 122H has a characteristic impedance equal to the impedance $Z_0$ of a load 30H. One end of the primary matching circuit 111H is connected to an connection point Q1H and the other end of the primary matching circuit 111H is connected to one end of the transmission line 122H. The other end of the transmission line 122H is connected to an output terminal P1H. The other end of the transmission line 122H (which end can also be said to be the connection point between the transmission line 122H and the output terminal P1H) is connected to one end of a switch SW2H. The other end of the switch SW2H is connected to the matching block 132H. The primary matching circuit 111H in the high band matching circuit 10H is a circuit that converts the impedance at the connection point Q1H to the impedance $Z_0$ at frequency $f_1$. When a signal with frequency $f_1$ is amplified, the switch SW2H is turned off and therefore no on-resistance loss occurs. On the other hand, when a signal with frequency $f_2$ is amplified, the switch SW2H is turned on. However, since frequency $f_2$ is close to frequency $f_1$, the value of $\Gamma$ in Equation (4) is small in the high band matching circuit 10H. Accordingly, high-frequency current flowing to the switch SW2H is not large.

As illustrated in FIG. 5, the low band matching circuit 10L has the same configuration as the BS-MN 10 that support two frequencies $f_3$ and $f_4$, and includes a primary matching circuit 111L, one transmission line 122L, one switch SW2L, and one matching block 132L. The transmission line 122L has a characteristic impedance equal to the impedance $Z_0$ of a load 30L. One end of the primary matching circuit 111L is connected to an connection point Q1L and the other end of the primary matching circuit 111L is connected to one end of the transmission line 122L. The other end of the transmission line 122L is connected to an output terminal P1L. The other end of the transmission line 122L (which end can also be said to be the connection point between the transmission line 122L and the output terminal P1L) is connected to one end of a switch SW2L. The other end of the switch SW2L is connected to the matching block 132L. The primary matching circuit 111L in the low band matching circuit 10L is a circuit that converts the impedance at the connection point Q1L to the impedance $Z_0$ at frequency $f_3$. When a signal with frequency $f_3$ is amplified, the switch SW2L is turned off and therefore no on-resistance loss occurs. That is, if a BS-MN 10 supporting four frequencies were used to operate at frequency $f_3$, low-frequency current would flow to the switch $SW_2$ and therefore an on-resistance loss would occur in the BS-MN 10 whereas when the low band matching circuit 10L is used to operate at frequency $f_3$, loss due to the on-resistance of a switch does not occur in the low band matching circuit 10L. When a signal with frequency $f_4$ is amplified, the switch SW2L is turned on. However, since frequency $f_4$ is close to $f_3$, the value of $\Gamma$ in Equation (4) is small. Accordingly, high-frequency current flowing to the switch SW2L is small. If the BS-MN 10 supporting four frequencies were used to operate at frequency $f_4$, a large high-frequency current would flow to the switch $SW_4$ and therefore a large on-resistance loss would occur in the BS-MN 10 whereas when the low band matching circuit 10L is used to operate at frequency $f_4$, high-frequency current flowing to the switch SW2L is not large and therefore loss due to the on-resistance of the switch in the low band matching circuit 10L is small.

Figure 3:
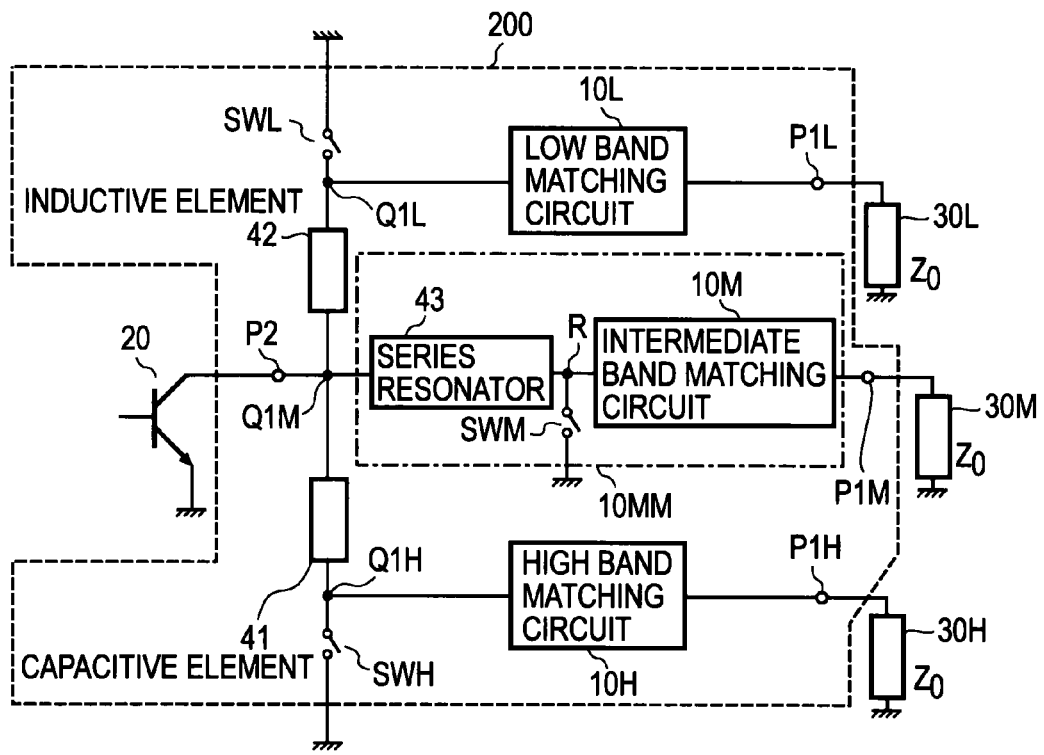
FIG. 3 is a block diagram illustrating a second embodiment of a multiband matching circuit according to the present invention.

The BS-MN 10 illustrated in FIG. 4 can also be applied to the band matching circuits 10L, 10H and 10M illustrated in FIG. 3. In this case, loss due to the on-resistance of a switch can be further reduced in the same way.

Figure 6:
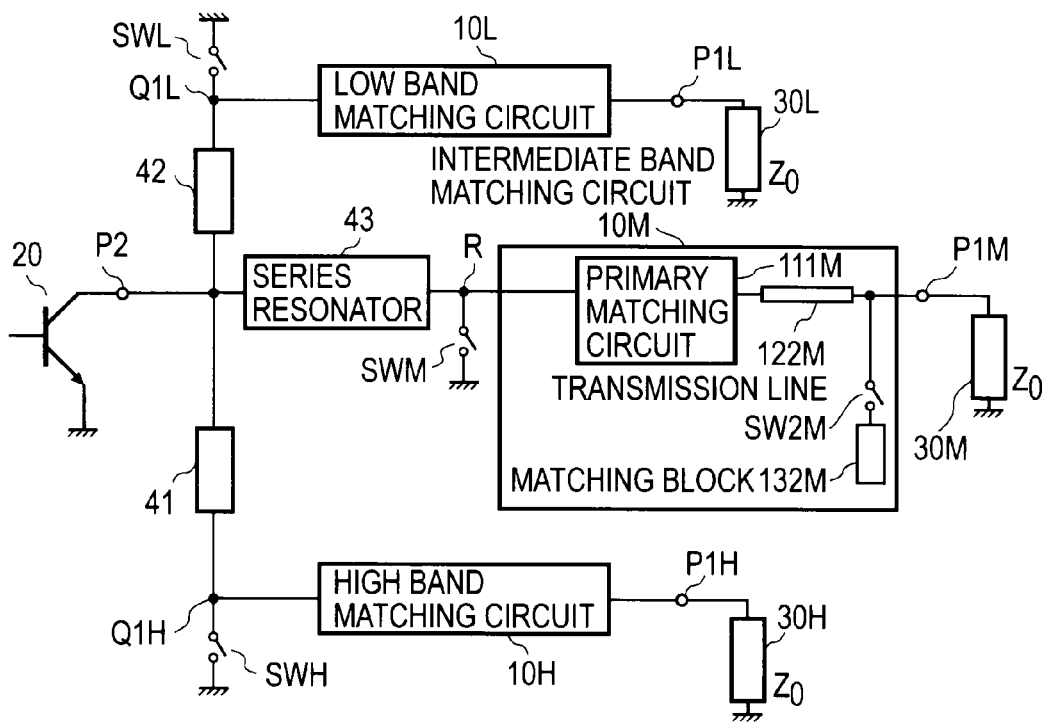
FIG. 6 is a block diagram of an embodiment in which the matching circuit illustrated in FIG. 4 is applied to the multiband matching circuit illustrated in FIG. 3.

FIG. 6 illustrates an embodiment in which the BS-MN 10 illustrated in FIG. 4 is applied to the matching circuits 10L, 10H and 10M illustrated in FIG. 3. Here, an example will be examined in which impedance matching for six frequencies $f_1$, $f_2$, $f_5$, $f_6$, $f_3$, $f_4$ ($f_1 > f_2 > f_5 > f_6 > f_3 > f_4$) is performed by a low band matching circuit 10L, an intermediate band matching circuit 10M and a high band matching circuit 10H in a distributed manner. In this case, the high band matching circuit 10H performs impedance matching for two frequencies, $f_1$ and $f_2$ ($f_1 > f_2$), the intermediate band matching circuit 10M performs impedance matching for another two frequencies, $f_5$ and $f_6$ ($f_5 > f_6$), and the low band matching circuit 10L performs impedance matching for the remaining two frequencies, $f_3$ and $f_4$ ($f_3 > f_4$), for example. Operations and advantages of the low band matching circuit 10L and the high band matching circuit 10H are the same as those in the configuration illustrated in FIG. 5 and therefore description of the matching circuits 10H and 10L will be omitted.

The intermediate band matching circuit 10M has the same configuration as the BS-MN 10 that supports two frequencies $f_5$ and $f_6$ and includes a primary matching circuit 111M, one transmission line 122M, one switch SW2M, and one matching block 132M as illustrated in FIG. 6. The transmission line 122M has a characteristic impedance equal to the impedance $Z_0$ of a load 30M. One end of the primary matching circuit 111M is connected to the other end of a series resonator 43 and the other end of the primary matching circuit 111M is connected to one end of the transmission line 122M. The other end of the transmission line 122M is connected to an output terminal P1M. Connected to this end of the transmission line 122M (which end can also be said to be the connection point between the transmission line 122M and the output terminal P1M) is one end of a switch SW2M. The other end of the switch SW2M is connected to the matching block 132M. The primary matching circuit 111M in the intermediate band matching circuit 10M is a circuit that converts the impedance at the interconnection point R to impedance $Z_0$ at frequency $f_5$. When a signal with frequency $f_5$ is amplified, the switch SW2M is turned off and therefore loss due to the on-resistance of the switch SW2M does not occur. If a BS-MN 10 that supports six frequencies were used to operate at frequency $f_5$, high-frequency current would flow to switch $SW_5$ and therefore loss due to the on-resistance of the switch $SW_5$ would occur in the BS-MN 10. In contrast, when the intermediate band matching circuit 10M is used to operate at frequency $f_5$, loss due to the on-resistance of the switch does not occur in the intermediate band matching circuit 10M. When a signal with frequency $f_6$ is amplified, the switch SW2M is turned on. However, since frequency $f_6$ is close to $f_5$ the value of Γ in Equation (4) is small in the intermediate band matching circuit 10M. Accordingly, high-frequency current flowing to the switch SW2M is small. If the BS-MN 10 supporting six frequencies were used to operate at frequency $f_6$, a large high-frequency current would flow to switch $SW_6$ and therefore a large on-resistance loss would occur in the BS-MN 10. In contrast, when the intermediate band matching circuit 10M is used to operate at frequency $f_6$, high-frequency current flowing to the switch SW2M is not large and therefore loss due to the on-resistance of the switch SW2M in the intermediate band matching circuit 10M is small.

Circuitry for controlling the operations of the switches in the embodiments described above can be implemented by a known technique and therefore has been omitted from the description and the drawings.

Experiment

For comparison with the embodiments of the present invention, first, a BS-MN 10 illustrated in FIG. 4 was designed that matches the impedance, 5Ω, at an input terminal P2 to the impedance, 50Ω, of a load 30 with the settings N=4 and $f_1$=2.5 GHz, $f_2$=2.3 GHz, $f_3$=0.9 GHz and $f_4$=0.8 GHz. In the BS-MN 10, the first matching circuit 111 was designed to function as a matching circuit for frequency $f_1$, the second matching circuit 11₂ was designed to function as a matching circuit for frequency $f_2$, the third matching circuit 11₃ was designed to function as a matching circuit for frequency $f_3$, and the fourth matching circuit 11₄ was designed to function as a matching circuit for frequency $f_4$.

Figure 7:
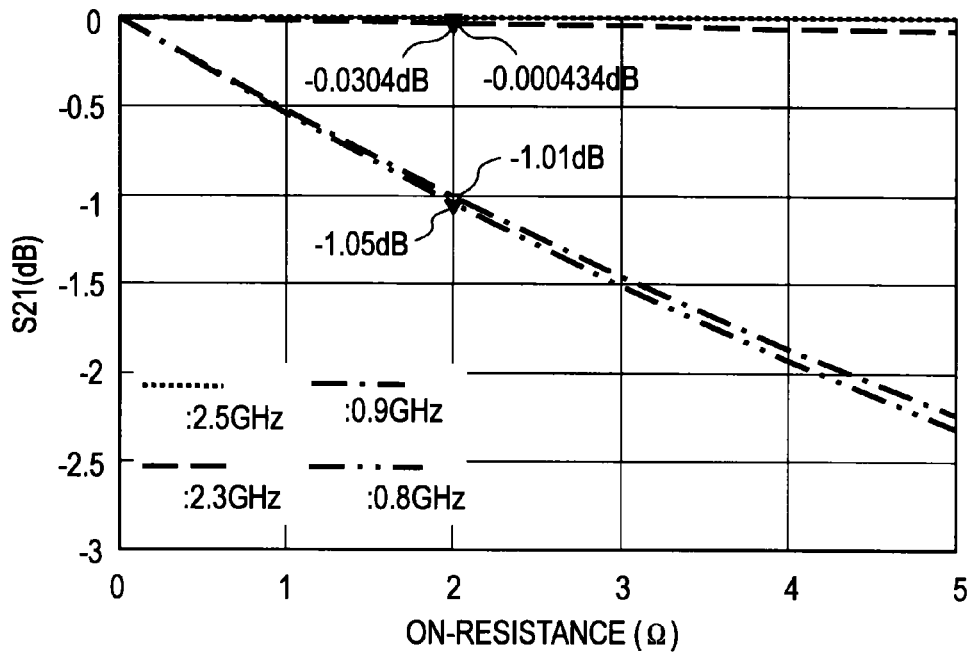
FIG. 7 is a graph of on-resistance loss characteristics of the band-switchable matching network illustrated in FIG. 4.

FIG. 7 shows calculated losses at the frequencies due to the on-resistances of switches $SW_i$ (i=2, 3, 4). As can be seen from FIG. 7, in the BS-MN 10, the losses at frequency $f_1$ at which all of the switches $SW_i$ (i=2, 3, 4) are turned off and at frequency $f_2$ close to frequency $f_1$ (at which switch $SW_2$ is turned on) are small whereas the losses at frequencies $f_3$ (at which switch $SW_3$ is turned on) and $f_4$ (at which switch $SW_4$ is tuned on) are large. For example, if the on-resistance of each switch is 2Ω, the losses in the BS-MN 10 is approximately 0.03 dB at frequency $f_2$, approximately 1.01 dB at frequency $f_3$, and approximately 1.05 dB at frequency $f_4$. In impedance matching at frequency $f_1$, all switches are turned off and therefore there is no loss due to on-resistance resistance of the switches. Since frequency $f_2$ is close to frequency $f_1$, the impedance conversion ratio Γ at frequency $f_2$ is small and high-frequency current flowing to switch $SW_2$ is small. Accordingly, the insertion loss due to the on-resistance of switch $SW_2$ is small. On the other hand, frequencies $f_3$ and $f_4$ are much farther from frequency $f_1$. Accordingly, the impedance conversion ratios Γ are large and a large high-frequency current flows to switches $SW_3$ and $SW_4$. Consequently, the insertion losses due to the on-resistances of switches $SW_3$ and $SW_4$ are large.

Then, a multiband matching circuit 100 (see FIG. 5) was designed using BS-MN 10 supporting two frequencies as a high band matching circuit 10H and a low band matching circuit 10L to match the impedance, 5Ω, at an input terminal P2 to the impedance, 50Ω, of loads 30 for a low frequency band $F_L$ ($f_4$=0.8 GHz and $f_3$=0.9 GHz) and a high frequency band $F_H$ ($f_2$=2.3 GHz and $f_1$=2.5 GHz). An inductor with an inductance of 3 nH was used as an inductive element 42 and a capacitor with a capacitance of 6 pF was used as a capacitive element 41. The band matching circuits 10L and 10H were designed by taking into account the effect of impedance conversion by the capacitive element 41 and the inductive element 42.

Figure 8:
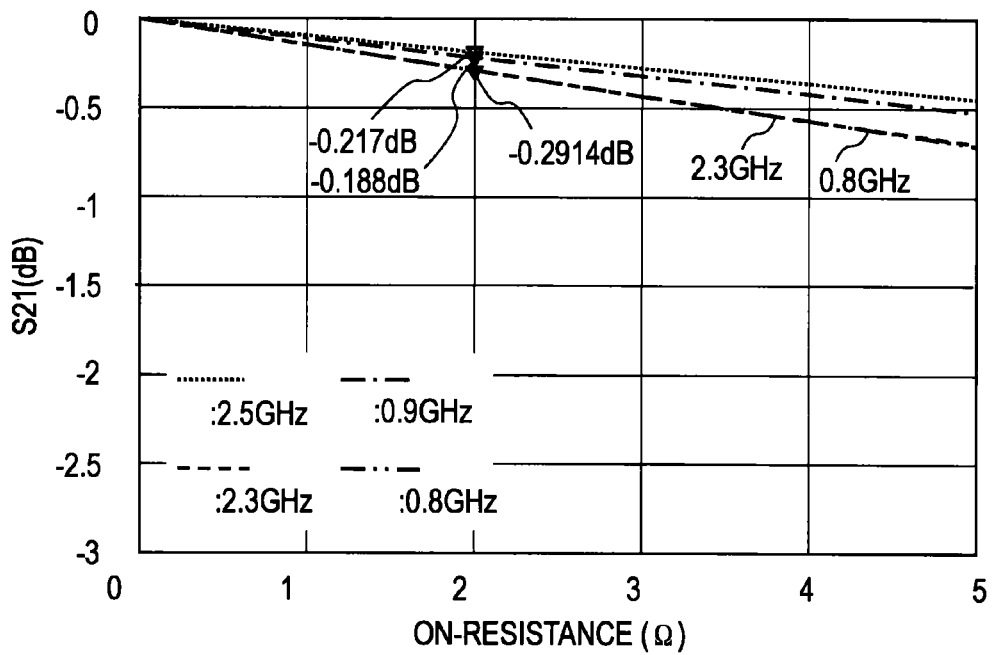
FIG. 8 is a graph of on-resistance loss characteristics of the multiband matching circuit of the embodiment illustrated in FIG. 5.

FIG. 8 illustrates calculated losses due to the on-resistances of the switches SW2L and SW2H in the multiband matching circuit 100 at the frequencies. For example, when the on-resistance of each switch is 2Ω, losses in the multiband matching circuit 100 are approximately 0.19 dB at frequency $f_1$, approximately 0.3 dB at frequency $f_2$, approximately 0.2 dB at frequency $f_3$, and approximately 0.3 dB at frequency $f_4$ (In FIG. 8, the curves representing S21 of frequencies $f_2$ and $f_4$ are almost overlap each other). In the BS-MN 10 used in the experiment described above, no switch was turned on in impedance matching at frequency $f_1$. In the multiband matching circuit 100, the switch SWL was turned on whereas the switch SW2H is turned off in impedance matching at frequency $f_1$, therefore a loss of approximately 0.19 dB is caused. Similarly, in the multiband matching circuit 100, the switch SWH is turned on whereas the switch SW2L is turned off in impedance matching at frequency $f_3$, therefore a loss of approximately 0.2 dB occurred. However, in the multiband matching circuit 100, the losses at frequencies $f_3$ and $f_4$ were significantly improved as compared with the BS-MN 10 used in the experiment described above. With all results considered, the multiband matching circuit 100 achieves impedance matching with losses less than 0.3 dB at four frequencies.

Applications

Figure 9:
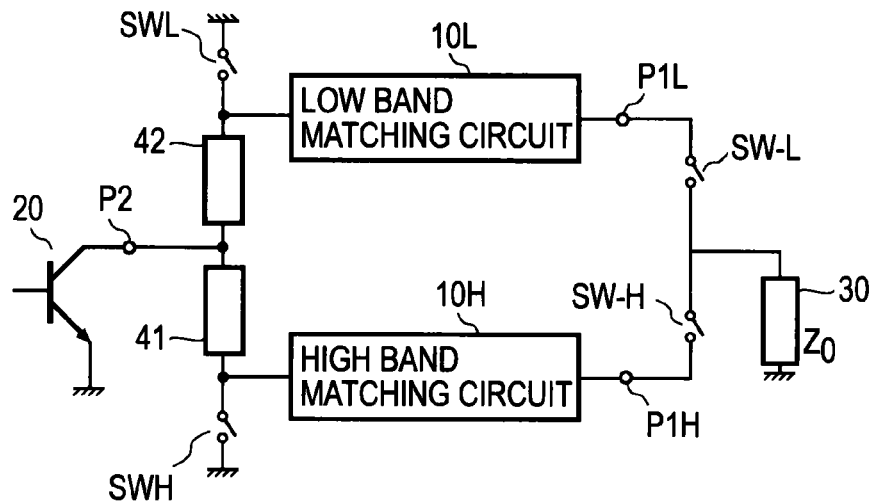
FIG. 9 is a block diagram illustrating an exemplary use of a multiband matching circuit according to the present invention.

FIG. 9 illustrates one application of the multiband matching circuit 100 illustrated in FIG. 2. The multiband matching circuit 100 illustrated in FIG. 9 is used for matching the impedance at the output of an amplification device 20 to the impedance of one load 30. Accordingly, output terminals P1L and P1H of the multiband matching circuit 100 are connected to the load 30 through switches SW-L and SW-H, respectively. When a low frequency band signal is output from the amplification device 20, the switch SW-L is turned on and the switch SW-H is turned off; when a high frequency band signal is output from the amplification device 20, the switch SW-H is turned on and the switch SW-L is turned off. Thus, one of the signals is provided to the load 30.

The impedance $Z_0$ of a load in a high frequency amplifying circuit in general is as large as 50Ω, for example, whereas the on-resistances of the switches SW-L and SW-H are low enough so that losses due to the on-resistances of the switches SW-L and SW-H are negligible.

Figure 10:
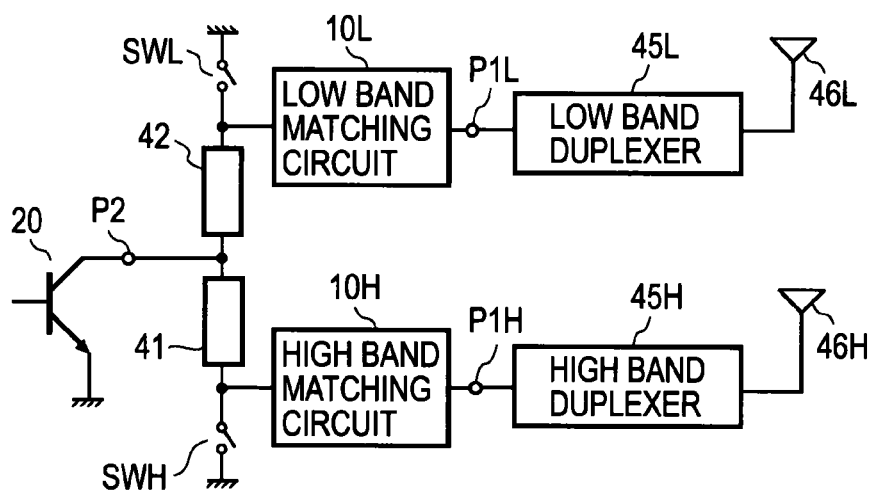
FIG. 10 is a block diagram illustrating another exemplary use of the multiband matching circuit according to the present invention.

FIG. 10 illustrates another application of the multiband matching circuit 100 illustrated in FIG. 2. The multiband matching circuit 100 illustrated in FIG. 10 is used for matching the impedance at the output of an amplification device 20 to the impedance of a low band duplexer 45L for transmission and reception or to the impedance of a high band duplexer 45H for transmission and reception. A transmit high-frequency signal from the amplification device 20 is provided to the low band duplexer 45L or the high band duplexer 45H through the low band matching circuit 10L or the high band matching circuit 10H, depending on the frequency of the transmit high-frequency signal, and then transmitted through an antenna 46L or 46H.

What is claimed is:

1. A multiband matching circuit comprising:
   an input terminal configured to be connected to an alternating-current circuit;
   a first output terminal configured to be connected to a device having a predetermined impedance;
   a second output terminal configured to be connected to a device having a predetermined impedance;
   an inductive element having one end connected to the input terminal;
   a first switch having one end connected to an other end of the inductive element and an other end grounded;
   a capacitive element having one end connected to the input terminal;
   a second switch having one end connected to an other end of the capacitive element and an other end grounded;
   a first-band matching circuit inserted between the first output terminal and a first connection point of the inductive element and the first switch, the first-band matching circuit matching an impedance at the first connection point to an impedance at the first output terminal in a first frequency band; and
   a second-band matching circuit inserted between the second output terminal and a second connection point of the capacitive element and the second switch, the second-band matching circuit matching an impedance at the second connection point to an impedance at the second output terminal in a second frequency band higher than the first frequency band.

2. The multiband matching circuit according to claim 1, further comprising:
   a third output terminal configured to be connected to a device having a predetermined impedance;
   a series resonator having one end connected to the input terminal and having a resonance frequency in a third frequency band between the first and second frequency bands;
   a third switch having one end connected to an other end of the series resonator and an other end grounded; and
   a third-band matching circuit inserted between the third output terminal and the other end of the series resonator, the third-band matching circuit matching an impedance at the other end of the series resonator to an impedance at the third output terminal in the third frequency band.

3. The multiband matching circuit according to claim 1, wherein:
   at least one of the first-band matching circuit and the second-band matching circuit comprises a primary matching circuit, N−1 transmission lines, N−1 switches, and N−1 matching blocks, where N is a predetermined integer greater than or equal to 2;
   when N is an integer greater than or equal to 3, letting j denote each integer in the range of 1 to N−2 inclusive,
   one end of the primary matching circuit is connected to one end of a first transmission line,
   an other end of a j-th transmission line is connected to one end of a j+1-th transmission line,
   one end of a j-th switch is connected to a connection point between the j-th transmission line and the j+1-th transmission line,
   an other end of the j-th switch is connected to a j-th matching block,
   one end of an N−1-th switch is connected to an other end of an N−1-th transmission line, and
   an other end of the N−1-th switch is connected to an N−1-th matching block;
   when N is equal to 2,
   one end of the primary matching circuit is connected to one end of a first transmission line;
   one end of a first switch is connected to an other end of the first transmission line; and
   an other end of the first switch is connected to a first matching block.

4. The multiband matching circuit according to claim 2, wherein:
   at least one of the first-band matching circuit, the second-band matching circuit, and the third-band matching circuit comprises a primary matching circuit, N−1 transmission lines, N−1 switches, and N−1 matching blocks, where N is a predetermined integer greater than or equal to 2; and
   when N is an integer greater than or equal to 3, letting j denote each integer in the range of 1 to N−2 inclusive,
   one end of the primary matching circuit is connected to one end of a first transmission line,
   an other end of a j-th transmission line is connected to one end of a j+1-th transmission line,
   one end of a j-th switch is connected to a connecting point between the j-th transmission line and the j+1-th transmission line,
   an other end of the j-th switch is connected to a j-th matching block,
   one end of an N−1-th switch is connected to an other end of an N−1-th transmission line, and
   an other end of the N−1-th switch is connected to an N−1-th matching block;
   when N is equal to 2,
   one end of the primary matching circuit is connected to one end of a first transmission line,
   one end of a first switch is connected to an other end of the first transmission line, and
   an other end of the first switch is connected to a first matching block.

* * * * *